United States Patent
Tomioka

(10) Patent No.: US 8,633,442 B2
(45) Date of Patent: Jan. 21, 2014

(54) TERAHERTZ WAVE GENERATING DEVICE, CAMERA, IMAGING DEVICE, AND MEASURING DEVICE

(75) Inventor: Hiroto Tomioka, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 109 days.

(21) Appl. No.: 13/443,414

(22) Filed: Apr. 10, 2012

(65) Prior Publication Data

US 2012/0261576 A1 Oct. 18, 2012

(30) Foreign Application Priority Data

Apr. 13, 2011 (JP) .................................. 2011-089539

(51) Int. Cl.
*G01J 5/02* (2006.01)

(52) U.S. Cl.
USPC ....................................................... 250/341.1

(58) Field of Classification Search
USPC ....................... 250/338.1–338.5, 341.1–341.8
See application file for complete search history.

(56) References Cited

U.S. PATENT DOCUMENTS

2011/0080329 A1* 4/2011 Nagel ........................... 343/770

FOREIGN PATENT DOCUMENTS

| JP | 2000-049402 A | 2/2000 |
| JP | 2005-317669 A | 11/2005 |
| JP | 2008-277565 A | 11/2008 |
| JP | 2009-105102 A | 5/2009 |

OTHER PUBLICATIONS

Jarrahi et al., "High power tunable terahertz generation based on photoconductive antenna arrays,", 2008, 2008 IEEE Microwave Symposium Digest, pp. 391-394.*

* cited by examiner

*Primary Examiner* — Kiho Kim
(74) *Attorney, Agent, or Firm* — Global IP Counselors, LLP

(57) ABSTRACT

A terahertz wave generating device includes a plurality of light sources and an antenna. The light sources are configured to generate pulsed light. The antenna is configured to generate terahertz waves by being irradiated with the pulsed light generated by the light sources. The antenna has a plurality of pairs of electrodes with the electrodes in each of the pairs facing each other across a gap portion with a predetermined distance. The light sources is configured to irradiate the gap portions between the electrodes in the pairs with the pulsed light such that the gap portions between the electrodes of at least two of the pairs are irradiated with the pulsed light at mutually different timings.

9 Claims, 11 Drawing Sheets

TERAHERTZ WAVE GENERATING DEVICE, CAMERA, IMAGING DEVICE, AND MEASURING DEVICE

CROSS-REFERENCE TO RELATED APPLICATIONS

This application claims priority to Japanese Patent Application No. 2011-089539 filed on Apr. 13, 2011. The entire disclosure of Japanese Patent Application No. 2011-089539 is hereby incorporated herein by reference.

BACKGROUND

1. Technical Field

The present invention relates to a terahertz wave generating device, camera, imaging device, and measuring device.

2. Related Art

In recent years, attention has been devoted to terahertz waves, which are electromagnetic waves with frequencies equal to or greater than 100 GHz and equal to or less than 30 THz. Terahertz waves can be used in various forms of measurement and non-destructive testing such as imaging and spectrometry.

A terahertz wave generating device for generating terahertz waves has a light source device that generates light pulses with sub-picosecond (several hundred femtosecond) pulse durations, and an antenna for generating terahertz waves upon irradiation with the light pulses generated by the light source device (see, for example, Japanese Laid-Open Patent Application Publication No. 2009-105102).

When this terahertz wave generating device is used to perform various forms of measurement and non-destructive testing such as imaging and spectrometry, the entire object under examination must be irradiated with terahertz waves. In order to irradiate the entire object with terahertz waves, the direction in which the terahertz waves are emitted would be varied by methods such as changing the orientation of the terahertz wave generating device.

SUMMARY

An object according to the present invention is to provide a terahertz wave generating device, camera, imaging device, and measuring device wherein the direction in which the terahertz waves are emitted can be easily varied.

The above object is achieved by the present invention as described below.

A terahertz wave generating device according to one aspect of the present invention includes a plurality of light sources and an antenna. The light sources are configured to generate pulsed light. The antenna is configured to generate terahertz waves by being irradiated with the pulsed light generated by the light sources. The antenna has a plurality of pairs of electrodes with the electrodes in each of the pairs facing each other across a gap portion with a predetermined distance. The light sources is configured to irradiate the gap portions between the electrodes in the pairs with the pulsed light such that the gap portions between the electrodes of at least two of the pairs are irradiated with the pulsed light at mutually different timings This allows the direction in which the terahertz waves are emitted to be easily and reliably varied.

In the terahertz wave generating device according to the above described aspect of present invention, a direction in which the terahertz waves generated by the antenna are emitted is preferably altered by irradiating the gap portions between the electrodes of the at least two of the pairs with the pulsed light at the mutually different timings.

This allows the direction in which the terahertz waves are emitted to be easily and reliably varied.

In the terahertz wave generating device according to the above described aspect of present invention, an offset amount of an irradiation timing is preferably less than a pulse duration of the pulsed light.

This allows the direction in which the terahertz waves are emitted to be easily and reliably varied.

In the terahertz wave generating device according to the above described aspect of present invention, each of the light sources is preferably a semiconductor laser.

This allows the provision of a terahertz wave generating device that is small and of simple construction.

In the terahertz wave generating device according to the above described aspect of present invention, the electrodes in the pairs disposed on one side of the gap portion are preferably electrically connected.

This allows the provision of a terahertz wave generating device of simple construction.

A terahertz wave generating device according to another aspect of the present invention includes a first light source, a second light source and an antenna. The first light source is configured to generate a first pulsed light. The second light source is configured to generate a second pulsed light having a phase different from that of the first pulsed light. The antenna is configured to generate terahertz waves by being irradiated with the first pulsed light and the second pulsed light, the antenna including a first electrode, a second electrode, a third electrode, and a fourth electrode such that a voltage is applied between the first electrode and the second electrode and a voltage is applied between the third electrode and the fourth electrode. The first light source is configured to irradiate the area between the first electrode and the second electrode with the first light pulse. The second light source is configured to irradiate the area between the third electrode and the fourth electrode with the second light pulse.

This allows the direction in which the terahertz waves are emitted to be easily and reliably varied.

A camera according to another aspect of the present invention includes a terahertz wave generating device and a terahertz wave detecting device. The terahertz wave generating device is configured to generate terahertz waves. The terahertz wave detecting device is configured to detect the terahertz waves emitted by the terahertz wave generating device and penetrating or reflecting off of an object. The terahertz wave generating device includes a plurality of light sources and an antenna. The light sources are configured to generate pulsed light. The antenna is configured to generate terahertz waves by being irradiated with the pulsed light generated by the light sources. The antenna has a plurality of pairs of electrodes with the electrodes in each of the pairs facing each other across a gap portion with a predetermined distance. The light sources is configured to irradiate the gap portions between the electrodes in the pairs with the pulsed light such that the gap portions between the electrodes of at least two of the pairs are irradiated with the pulsed light at mutually different timings.

This allows the provision of a camera having the effects according to the present invention.

An imaging device according to another aspect of the present invention includes a terahertz wave generating device, a terahertz wave detecting device and an image forming unit. The terahertz wave generating device is configured to generate terahertz waves. The terahertz wave detecting device is configured to detect the terahertz waves emitted by the terahertz wave generating device and penetrating or reflecting off of an object. The image forming unit is configured to form an image of the object based on a result of a detection made by the terahertz wave detecting device. The terahertz wave generating device includes a plurality of light sources and an antenna. The light sources are configured to generate pulsed light. The antenna is configured to generate terahertz waves by being irradiated with the pulsed light generated by the light sources. The antenna has a plurality of pairs of electrodes with the electrodes in each of the pairs facing each other across a gap portion with a predetermined distance. The light sources are configured to irradiate the gap portions between the electrodes in the pairs with the pulsed light such that the gap portions between the electrodes of at least two of the pairs are irradiated with the pulsed light at mutually different timings.

This allows the provision of an imaging device having the effects according to the present invention.

A measuring device includes a terahertz wave generating device, a terahertz wave detecting device, and a measuring unit. The terahertz wave generating device is configured to generate terahertz waves. The terahertz wave detecting device is configured to detect the terahertz waves emitted by the terahertz wave generating device and penetrating or reflecting off of an object. The measuring unit is configured to measure the object based on a result of a detection made by the terahertz wave detecting device. The terahertz wave generating device includes a plurality of light sources and an antenna. The light sources are configured to generate pulsed light. The antenna is configured to generate terahertz waves by being irradiated with the pulsed light generated by the light sources. The antenna has a plurality of pairs of electrodes with the electrodes in each of the pairs facing each other across a gap portion with a predetermined distance. The light sources are configured to irradiate the gap portions between the electrodes in the pairs with the pulsed light such that the gap portions between the electrodes of at least two of the pairs are irradiated with the pulsed light at mutually different timings.

This allows the provision of a measuring device having the effects according to the present invention.

BRIEF DESCRIPTION OF THE DRAWINGS

Referring now to the attached drawings which form a part of this original disclosure.

DETAILED DESCRIPTION OF EXEMPLARY EMBODIMENTS

Hereafter follows a detailed description of a preferred embodiment of the terahertz wave generating device, camera, imaging device, and measuring device according to the present invention with reference to the attached drawings.

First Embodiment

Figure 1:
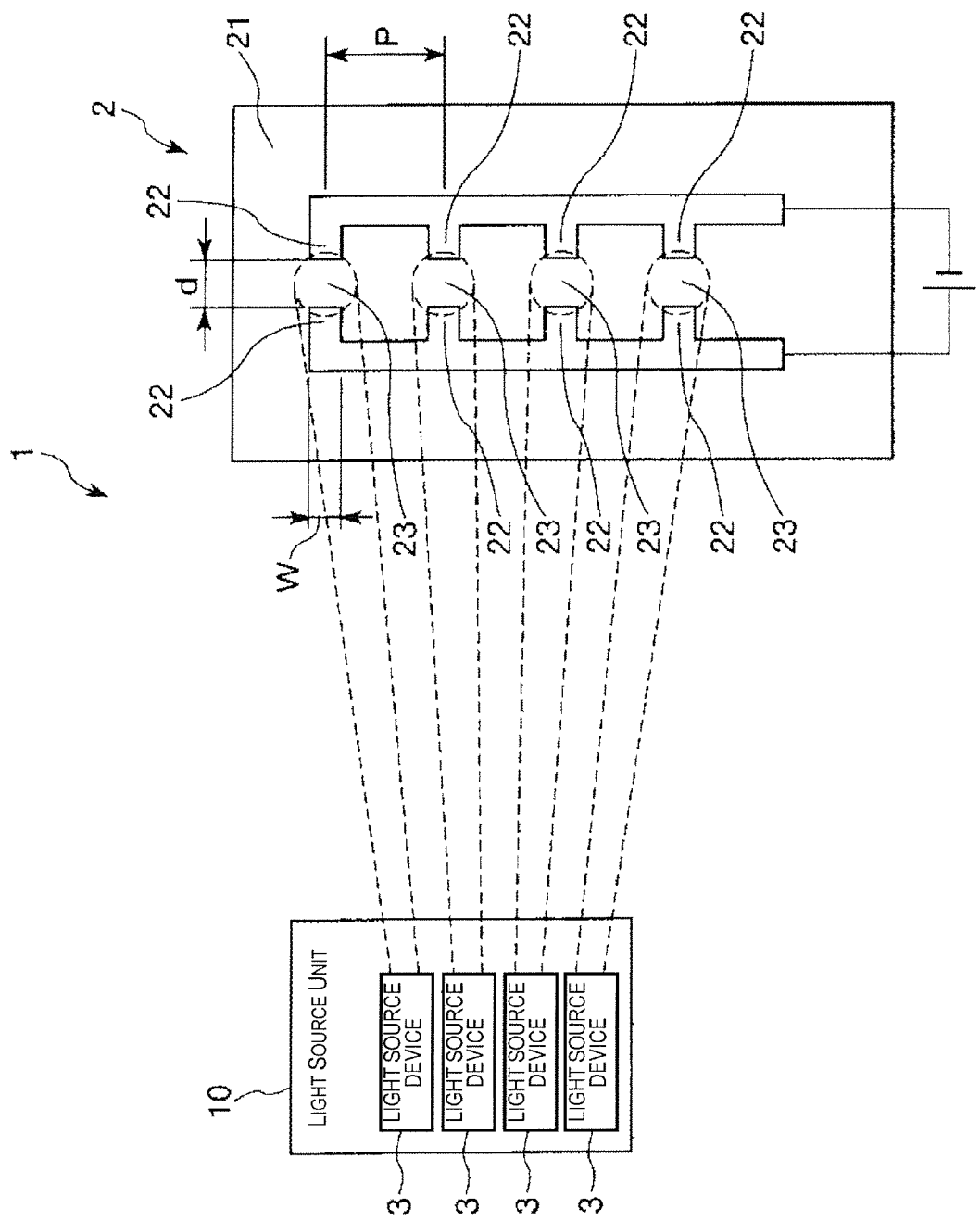
FIG. 1 is a schematic view of a first embodiment of a terahertz wave generating device according to the present invention.

FIG. 1 is a schematic view of a first embodiment of a terahertz wave generating device according to the present invention.

As shown in FIG. 1, a terahertz wave generating device 1 has a light source unit 10 that generates a plurality of light pulses (pulsed light) at different timings, and an antenna 2 that generates terahertz waves upon irradiation by the light pulses generated by the light source unit 10.

The antenna 2 of this embodiment is a dipole photoconductive antenna (PCA), and has a substrate 21 that is a semiconductor substrate, and a plurality of pairs of electrodes 22 disposed on the semiconductor substrate 21 across a gap 23, the number of pairs of electrodes 22 being, for example, four, as in the configuration illustrated in the drawing. A predetermined voltage is applied between each of the pairs of electrodes 22, and when the area between the electrodes 22 is irradiated by light pulses (pulsed light), the antenna 2 generates terahertz waves. "Terahertz waves" here refers to electromagnetic waves with frequencies equal to or greater than 100 Ghz and equal to or less than 30 THz, especially to electromagnetic waves with frequencies equal to or greater than 300 Ghz and equal to or less than 3 THz. In this embodiment, electrodes on one side of the plurality of pairs of electrodes 22 and electrodes on the other side of the plurality of pairs of electrodes 22 are electrically connected by a conductor, and an equal voltage is applied to the electrodes on one side of the plurality of pairs of electrodes 22 and the electrodes on the other side of the plurality of pairs of electrodes 22. A configuration wherein an individual power source is connected between each of the plurality of pairs of electrodes 22 and voltage is individually applied between the plurality of pairs of electrodes 22 is also acceptable.

The substrate 21 as shown in the drawing is quadrangular in shape. The shape of the substrate 21 is not limited to a quadrangle, and may be, for example, a circle, an ellipse, a triangle, a pentagon, a hexagon, or the like.

There is no particular limit upon the distance d between a pair of electrodes 22, which may be set as conditions dictate, but a length of no less than 1 μm and no greater than 10 μm is preferable.

There is no particular limit upon the width w of a pair of electrodes 22, which may be set as conditions dictate, but a length of no less than 1 μm and no greater than 10 μm is preferable.

There is no particular limit upon the pitch p of a pair of electrodes 22, which may be set as conditions dictate, but a length of no less than 10 μm and no greater than 1 mm is preferable.

There is no particular limit upon the dimensions of the antenna 2, which may be set as conditions dictate, but a length and width each of no less than 100 μm and no greater than 10 mm is preferable.

The terahertz wave generating device 1 irradiates the area between different pairs of electrodes 22 with light pulses generated by each light source device 3, described hereafter, of the light source unit 10. Thus, each light source device 3 and each pair of electrodes 22 forms a one-to-one relationship. In other words, each light source device 3 irradiates a different pair of electrodes 22. The area between each pair of electrodes 22 is irradiated with light pulses at different timings by the light source unit 10. Through this, terahertz waves of different phases are generated between each pair of electrodes 22, the terahertz waves are synthesized, and, taking the case where the light pulse irradiation timing is fixed as a reference, the direction in which the terahertz waves generated by the antenna 2 are emitted is varied.

There is no particular limit on the amount by which the light pulse irradiation timing is varied (an offset amount), and it may be set depending on the target direction in which the terahertz waves are emitted and other conditions, but it is preferable that the amount be less than the pulse duration of the light pulses. Specifically, the amount by which the light pulse irradiation timing is varied is preferably 1% or greater and 50% or less of the pulse duration of the light pulses, and more preferably 3% or greater and 40% or less.

By adjusting the amount by which the light pulse irradiation timing is varied, the direction in which the terahertz waves are emitted can be adjusted.

This can be effected by adopting a configuration wherein a calibration curve, such as an equation or table, illustrating the relationship between the amount by which the irradiation timing is varied and the direction in which the terahertz waves are emitted for the terahertz wave generating device 1 is obtained in advance through experimentation, stored in a memory unit, not shown in the drawings, of the terahertz wave generating device 1, and loaded and used as necessary.

Next, the light source unit 10 will be described.

The light source unit 10 has a plurality of light source devices (light sources) 3, with the configuration shown in the drawings having four light source devices 3. Hereafter follows a description of one of the four light source devices 3 as a representative example.

Figure 2:
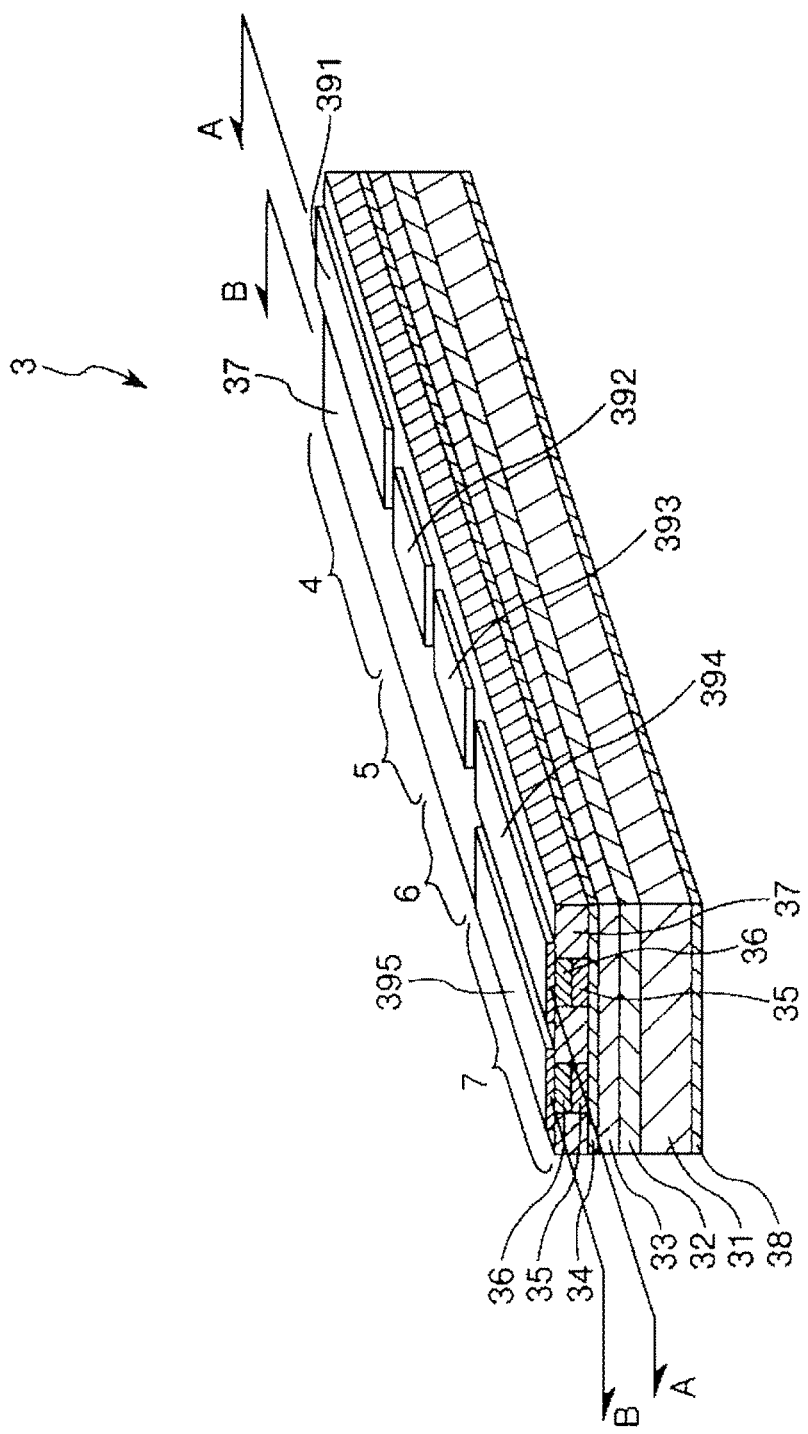
FIG. 2 is a perspective cross-sectional view of a light source device of the terahertz wave generating device shown in FIG. 1.
Figure 3:
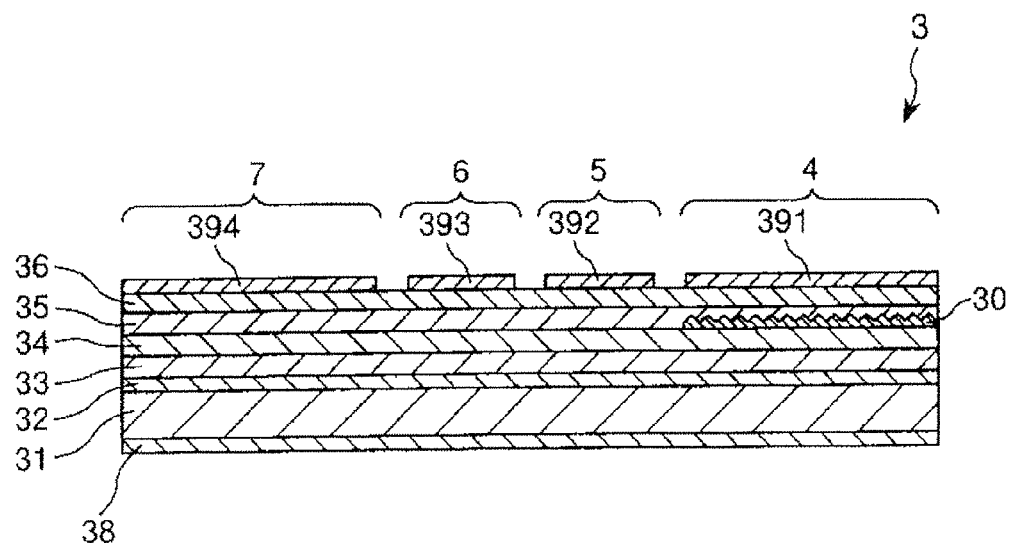
FIG. 3 is a cross-sectional view along line A-A in FIG. 2.
Figure 4:
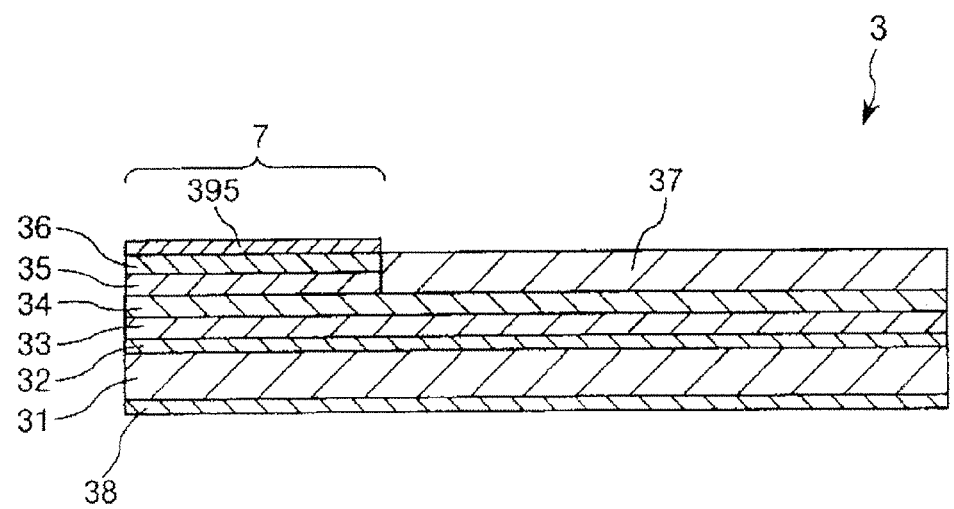
FIG. 4 is a cross-sectional view along line B-B in FIG. 2.

As shown in FIGS. 2 through 4, the light source device 3 of this embodiment has a light pulse generator 4 for generating light pulses, a first pulse compressor 5 for compressing the light pulses generated by the light pulse generator 4, a second pulse compressor 7 for compressing the light pulses compressed by the first pulse compressor 5, and an amplifier 6 for amplifying the light pulses.

The amplifier 6 is provided before the first pulse compressor 5 or between the first pulse compressor 5 and the second pulse compressor 7; in the configuration shown in the drawings, the amplifier 6 is provided between the first pulse compressor 5 and the second pulse compressor 7. Because of this, the light pulses compressed by the first pulse compressor 5 are amplified by the amplifier 6, and the light pulses amplified by the amplifier 6 are compressed by the second pulse compressor 7.

There is no particular limitation upon the pulse duration (half-width) of the light pulses emitted by the light source device 3, but the duration is preferably 10 femtoseconds or greater and 800 femtoseconds or less.

The light pulse generator 4 can be a so-called semiconductor laser such as, for example, a DBR laser or a mode synchronous laser. There is no particular limit upon the pulse duration of the light pulses generated by the light pulse generator 4, but a duration of 1 picosecond or greater and 100 picoseconds or less is preferable.

The first pulse compressor 5 performs pulse compression based on saturable absorption. Specifically, the first pulse compressor 5 has a saturable absorber, which compresses the light pulses and reduces the pulse duration thereof.

The second pulse compressor 7 performs pulse compression based on group velocity dispersion correction. Specifically, the first pulse compressor 5 has a group velocity dispersion corrector (in this embodiment, a connected waveguide structure) that compresses the light pulses and reduces the pulse duration thereof.

The light pulse generator 4, first pulse compressor 5, amplifier 6, and second pulse compressor 7 of the light source device 3 are integrated; i.e., installed on the same substrate.

Specifically, the light source device 3 has a substrate 31 that is a semiconductor substrate, a clad layer 32 provided on the substrate 31, an active layer 33 provided on the clad layer 32, an etch stop layer 34 for a waveguide configuring process provided on the active layer 33, a clad layer 35 provided on the waveguide configuring process etch stop layer 34, a contact layer 36 provided on the clad layer 35, an insulating layer 37 provided on the waveguide configuring process etch stop layer 34, an electrode 38 provided nearer to the clad layer 32 provided on the surface of the substrate 31, and electrodes 391, 392, 393, 394, and 395 provided nearer to the clad layer 35 provided on the surfaces of the contact layer 36 and insulating layer 37. A diffraction grating 30 is provided between the waveguide configuring process etch stop layer 34 of the second pulse compressor 7 and the clad layer 35. The waveguide configuring process etch stop layer is not limited to being provided directly over the active layer, and may be provided, for example, within the clad layer.

There is no particular limit upon the materials constituting each part; an example of the material for the substrate 31 and contact layer 36 is GaAs. An example of material for the clad layer 32 and 35, the waveguide configuring process etch stop layer 34, and the diffraction grating 30 is AlGaAs. The material for the active layer 33 has, for example, a quantum effect—having structure known as a multiquantum well. A specific example of the structure of the active layer 33 is, for example, a distributed-index multiquantum well constituted by a multiquantum well with a plurality of alternating well layers (GaAs well layers) and barrier layers (AlGaAs barrier layers).

In the configuration shown in the drawing, the waveguide of the light source device 3 is constituted by the clad layer 32, the active layer 33, the waveguide configuring process etch stop layer 34, and the clad layer 35. The clad layer 35 is provided only over the waveguide in a shape conforming to the waveguide. The clad layer 35 is formed by removing unnecessary portions through etching. Depending on the manufacturing method, the waveguide configuring process etch stop layer 34 may be omitted.

Two each of the clad layer 35 and the contact layer 36 are provided. One clad layer 35 and contact layer 36 constitute part of the light pulse generator 4, first pulse compressor 5, amplifier 6, and second pulse compressor 7, and are provided in a series; and the other clad layer 35 and contact layer 36 constitute part of the second pulse compressor 7. Specifically, a pair of clad layers 35 and a pair of contact layers 36 are provided in the second pulse compressor 7.

The electrode 391 is provided in correspondence to the clad layer 35 of the light pulse generator 4, the electrode 392 is provided in correspondence to the clad layer 35 of the first pulse compressor 5, the electrode 393 is provided in correspondence to the clad layer 35 of the amplifier 6, and the electrode 394 and 395 are provided in correspondence to the two clad layers 35 of the second pulse compressor 7. The electrode 38 is a common electrode of the light pulse generator 4, first pulse compressor 5, amplifier 6, and second pulse compressor 7. The electrode 38 and electrode 391 form the pair of electrodes of the light pulse generator 4, the electrode 38 and the electrode 392 form the pair of electrodes of the first pulse compressor 5, the electrode 38 and the electrode 393 form the pair of electrodes of the amplifier 6, and the electrode 38 and electrode 394 and the electrode 38 and electrode 395 form the two pairs of electrodes of the second pulse compressor 7.

In the configuration shown in the drawings, the overall shape of the light source device 3 is a rectangle, but it shall be apparent that the shape is not limited to this.

There is no particular limit upon the dimensions of the light source device 3; they may be, for example, 1 mm or more and 10 mm or less×0.5 mm or more and 5 mm or less×0.1 mm or more and 1 mm or less.

Next, the operation of the terahertz wave generating device 1 will be described.

First, light pulses are generated by the light pulse generator 4 of each light source device 3 of the light source unit 10 of the terahertz wave generating device 1. Hereafter follows a description of one light source device 3 as a representative example. The pulse duration of the light pulses generated by the light pulse generator 4 is larger than a target pulse duration. The light pulses generated by the light pulse generator 4 follow the waveguide through the first pulse compressor 5, amplifier 6, and second pulse compressor 7 in turn.

First, the first pulse compressor 5 compresses the light pulses using saturable absorption, reducing the pulse duration of the light pulses. Next, the light pulses are amplified by the amplifier 6. Finally, the second pulse compressor 7 compresses the light pulses using group velocity dispersion correction, further reducing the pulse duration of the light pulses. In this way, light pulses of a target pulse duration are generated and emitted from the second pulse compressor 7. The light pulses are emitted from each light source device 3 at different timings (or phases).

The light pulses emitted from each light source device 3 irradiate the area between the electrodes 22 corresponding to the antenna 2 at different timings (or phases), generating terahertz waves. As described above, the direction in which the terahertz waves are emitted is varied, taking the case where the light pulse irradiation timing is fixed as a reference.

As described above, this terahertz wave generating device 1 allows the direction in which the terahertz waves are emitted to be easily and reliably varied.

Because the light source device 3 has the first pulse compressor 5, amplifier 6, and second pulse compressor 7, it is possible to generate light pulses of a desired wave height and pulse duration while enabling the miniaturization of the light source devices 3, and by extension the terahertz wave generating device 1; making it possible in turn to reliably generate the desired terahertz waves. By varying the timing of a drive signal of the light source device 3, it is possible to easily change the light emission timing of the light source device 3 when irradiating the antenna 2. In other words, there is no need to add a retarding element or the like in order to change the timing of the light pulses irradiating the antenna 2, enabling a simple configuration to be adopted.

The area between the electrodes of each pair of electrodes 22 may be irradiated with light pulses at identical timings.

Alternatively, the areas between two or three pairs of electrodes 22 out of the four pairs of electrodes 22 may be irradiated with light pulses at different timings.

The number of the light source devices 3 of the light source unit 10 and the number of the pairs of electrodes 22 of the antenna 2 are not limited to four, and may be two, three, five, or more.

Second Embodiment

Figure 5:
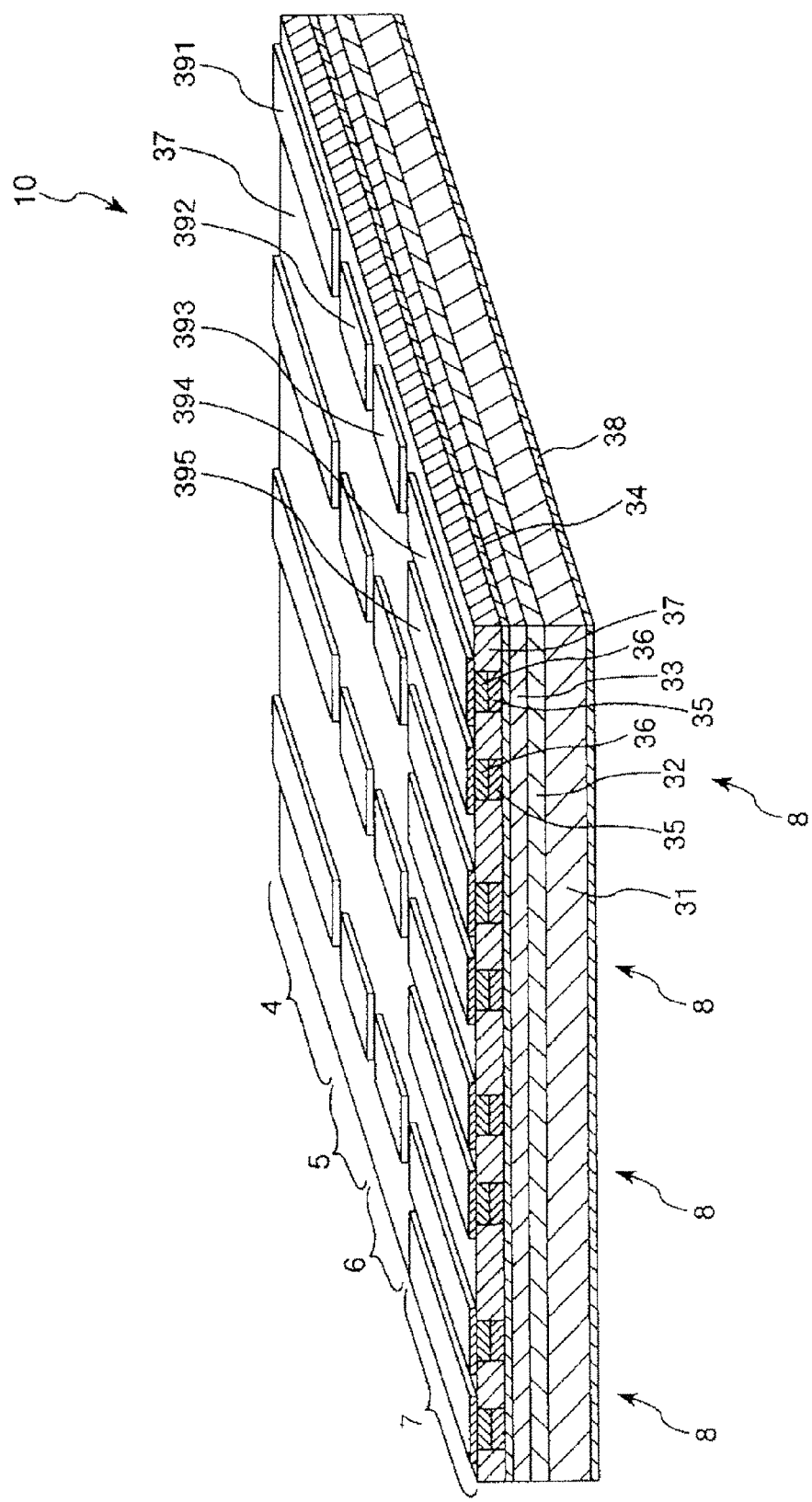
FIG. 5 is a perspective cross-sectional view of a light source unit in a second embodiment of the terahertz wave generating device according to the present invention.

FIG. 5 is a perspective cross-sectional view of a light source unit in a second embodiment of the terahertz wave generating device according to the present invention.

The following description will focus on the differences between the second embodiment and the embodiment given above; similar elements will be given the same numbering as in the case of the embodiment given above, and detailed description thereof will be omitted.

As shown in FIG. 5, a light source unit 10 of the terahertz wave generating device 1 according to the second embodiment has a plurality of units 8 having a light pulse generator 4, a first pulse compressor 5, an amplifier 6, and a second pulse compressor 7; and the units are lined up in parallel; i.e., in an array. Each unit 8 corresponds to a light source device 3 of the first embodiment.

This second embodiment may be applied to a third embodiment, fourth embodiment, and fifth embodiment described hereafter.

Third Embodiment

Figure 6:
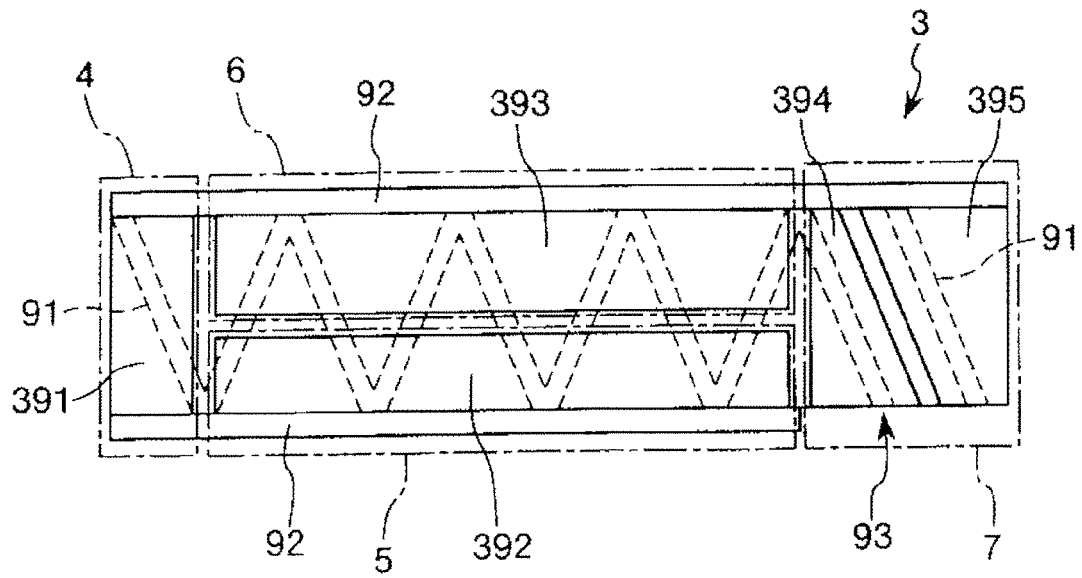
FIG. 6 is a schematic overhead view of a light source device in a third embodiment of the terahertz wave generating device according to the present invention.

FIG. 6 is a schematic overhead view of a light source device in a third embodiment of the terahertz wave generating device according to the present invention. In FIG. 6, a waveguide 91 is represented by a dotted line, and the first pulse compressor 5, amplifier 6, and second pulse compressor 7 are outlined by dotted lines.

The following description will focus on the differences between the third embodiment and the embodiment given above; similar elements will be given the same numbering as in the case of the embodiment given above, and detailed description thereof will be omitted.

As shown in FIG. 6, a waveguide 91 of a light source device 3 of a terahertz wave generating device 1 according to the third embodiment bends a plurality of times. In other words, the waveguide 91 is formed in a zigzag pattern.

The first pulse compressor 5 is located in the lower middle portion of FIG. 6, and the amplifier 6 is located in the upper middle portion of FIG. 6. The waveguide 91 bends a plurality of times within both the first pulse compressor 5 and the amplifier 6. The waveguide 91 also bends a plurality of times within the boundary between the light pulse generator 4 and the first pulse compressor 5 and the boundary between the amplifier 6 and the second pulse compressor 7.

The light source device 3 has a reflective layer 92 that reflects the light pulses at the bends in the waveguide 91. One reflective layer 92 is provided on each of a pair of sides of the light source device. The reflective layer 92 enables the light pulses to be reflected so that the light pulses proceed along the waveguide 91.

The reflective layer 92 is not provided at an emitter 93 of the light pulses of the light source device 3. An anti-reflective layer (not illustrated) may be provided at the emitter 93.

Because the waveguide 91 of the light source device 3 of this terahertz wave generating device 1 is bent a plurality of times, it is possible to increase the length of the light path, i.e., the linear distance of the waveguide 91, which in turn allows the length of the light source device 3 to be shortened, enabling further size reductions.

Fourth Embodiment

Figure 7:
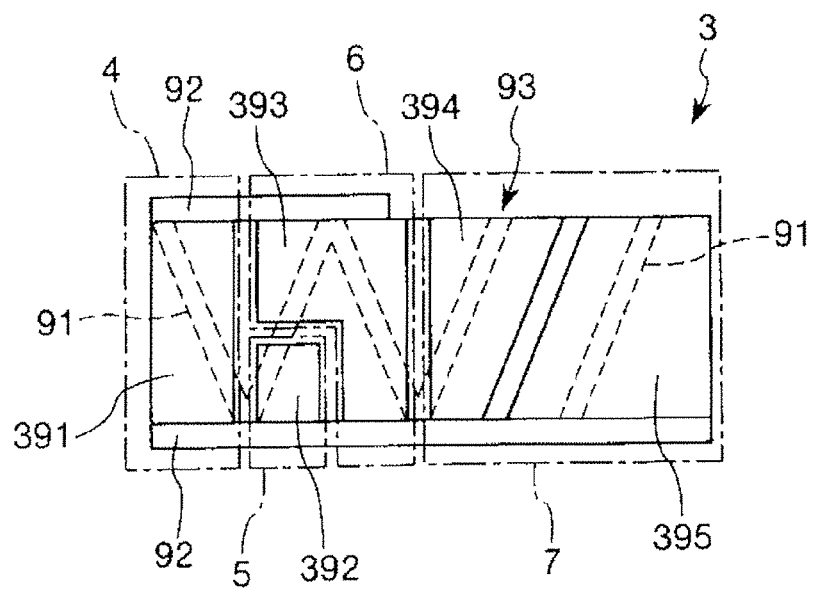
FIG. 7 is a schematic overhead view of a light source device in a fourth embodiment of the terahertz wave generating device according to the present invention.

FIG. 7 is a schematic overhead view of a light source device in a third embodiment of the terahertz wave generating device according to the present invention. In FIG. 7, a waveguide is represented by a dotted line, and the first pulse compressor 5, amplifier 6, and second pulse compressor 7 are outlined by dotted lines.

The following description will focus on the differences between the fourth embodiment and the embodiment given above; similar elements will be given the same numbering as in the case of the embodiment given above, and detailed description thereof will be omitted.

As shown in FIG. 7, a waveguide 91 bends three times within a light source device 3 of a terahertz wave generating device 1 according to the fourth embodiment, with the waveguide 91 bending only once within an amplifier 6.

If the amplifier 6 is provided before the first pulse compressor 5, the waveguide 91 bends only once within in the first pulse compressor 5.

Fifth Embodiment

Figure 8:
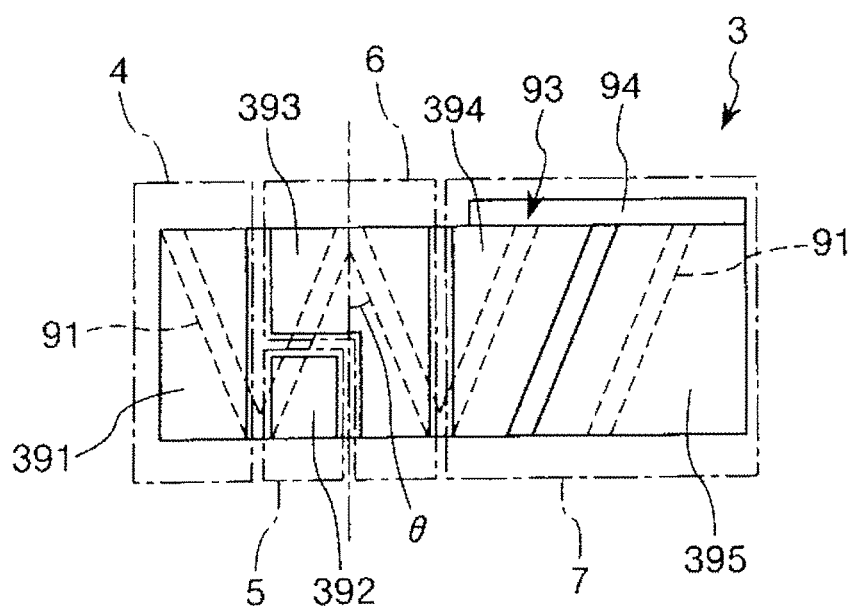
FIG. 8 is a schematic overhead view of a light source device in a fifth embodiment of the terahertz wave generating device according to the present invention.

FIG. 8 is a schematic overhead view of a light source device in a fifth embodiment of the terahertz wave generating device according to the present invention. In FIG. 8, a waveguide is represented by a dotted line, and the first pulse compressor 5, amplifier 6, and second pulse compressor 7 are outlined by dotted lines.

The following description will focus on the differences between the fifth embodiment and the fourth embodiment given above, and detailed description of similar points will be omitted.

As shown in FIG. 8, a reflective layer 92 is omitted in the light source device 3 of the terahertz wave generating device 1 of the fifth embodiment.

The angle θ of the bends in the waveguide 91 as shown in FIG. 8 is set to be equal to or greater than the critical angle. This enables the light pulses to be reflected without providing a reflective layer 92 on the bends of the waveguide 91, allowing for a simplified construction.

An anti-reflective layer 94 is provided at the emitter 93 of the light pulses of the light source device 3. This allows light pulses to be emitted from the emitter 93.

This fifth embodiment may also be applied to the third embodiment.

Embodiment of Imaging Device

Figure 9:
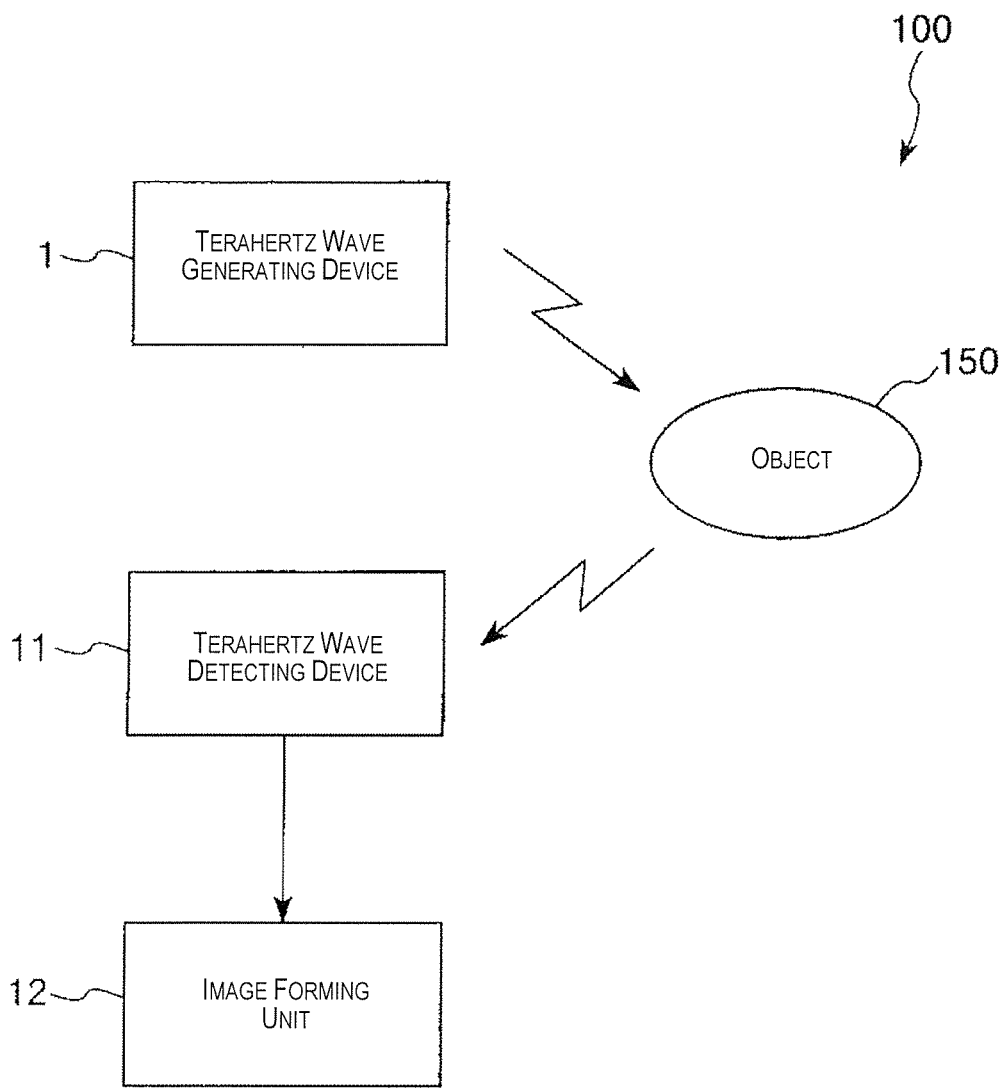
FIG. 9 is a block diagram of an embodiment of an imaging device according to the present invention.
Figure 10:
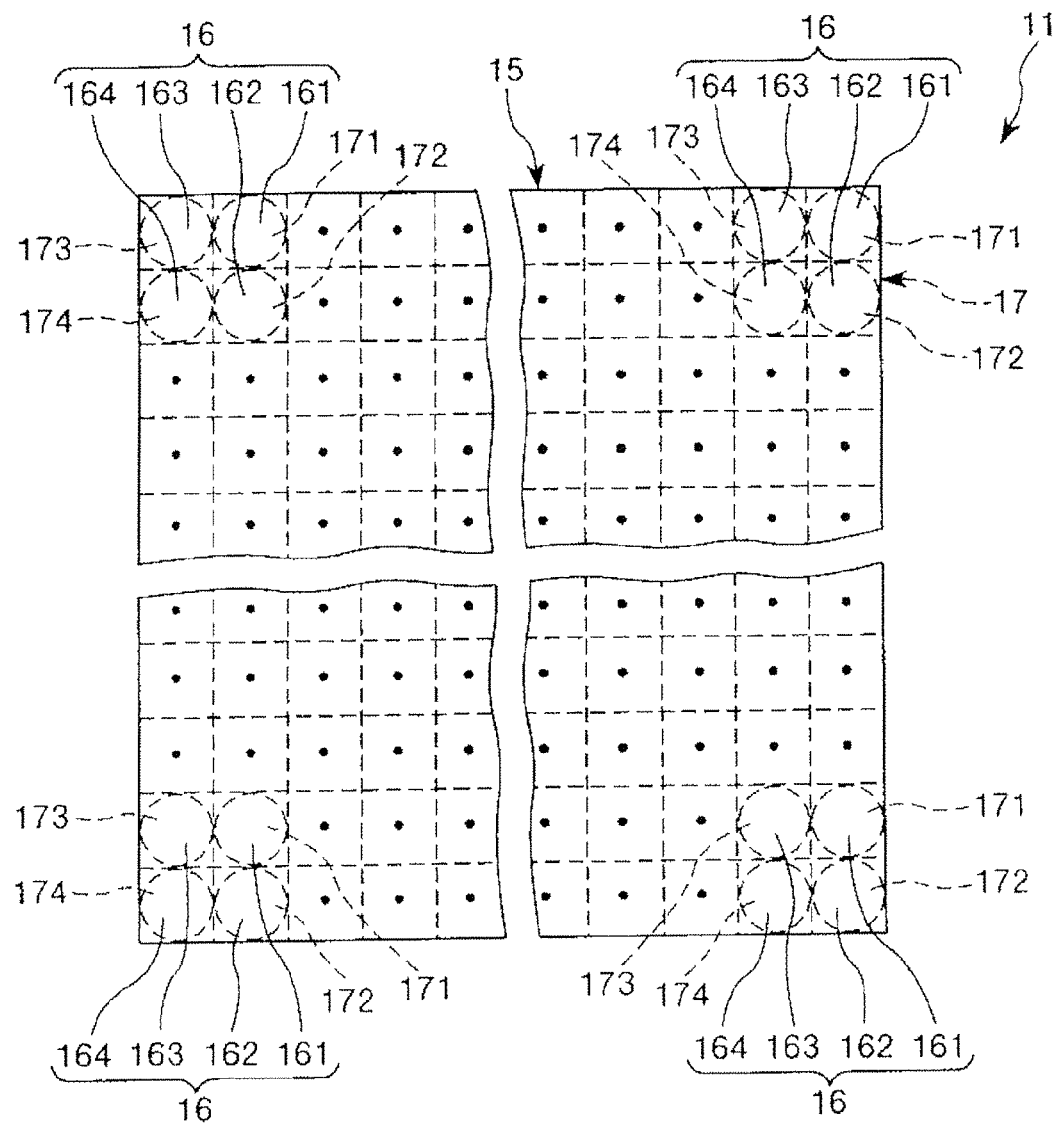
FIG. 10 is an overhead view of a terahertz wave detecting device of the imaging device shown in FIG. 9.

FIG. 9 is a block diagram of an embodiment of an imaging device according to the present invention. FIG. 10 is an overhead view of a terahertz wave detecting device of the imaging device shown in FIG. 9.

As shown in FIG. 9, an imaging device 100 has a terahertz wave generating device 1 for generating terahertz waves, a terahertz wave detecting device 11 for detecting terahertz waves emitted from a terahertz wave generating device 1 and penetrating or reflected off of an object 150, and an image forming unit 12 for forming an image, i.e., image data, of the object 150 based on the result of a detection made by the terahertz wave detecting device 11.

In this embodiment, the terahertz wave generating device of one of the first embodiment through the fifth embodiment is used as the terahertz wave generating device 1.

The terahertz wave detecting device 11 used has a filter 15 that allows terahertz waves of a target wavelength to pass, and a detection unit 17 that converts the terahertz waves of a target wavelength passing through the filter 15 into heat and detects them. The detection unit 17 used is, for example, one that detects terahertz waves by converting them into heat; i.e., converts the terahertz waves into heat and detects the energy (intensity) thereof. Examples of such a detection unit include a pyroelectric sensor, a bolometer, or the like. It shall be apparent that the terahertz wave detecting device 11 is not limited to devices having the configurations described above.

The filter 15 has a plurality of pixels (unit filters) 16 arranged in two dimensions. In other words, the pixels 16 are arranged in rows.

Each pixel 16 has a plurality of fields admitting terahertz waves of different wavelengths; i.e., a plurality of fields in which the wavelengths of the admitted terahertz waves ("admitted wavelength") differ. In the configuration shown in the drawing, each pixel 16 has a first field 161, a second field 162, a third field 163, and a fourth field 164.

The detection unit 17 has a first detecting unit 171, a second detecting unit 172, and third detecting unit 173, and a fourth detecting unit 174 corresponding to the first field 161, second field 162, third field 163, and fourth field 164, respectively, of each pixel 16 of the filter 15. The first detecting unit 171, second detecting unit 172, third detecting unit 173, and fourth detecting unit 174 convert to heat and detect the terahertz waves admitted by the first field 161, second field 162, third field 163, and fourth field 164 of the pixel 16, respectively. Each pixel 16 is capable of reliably detecting four types of terahertz waves of a target wavelength.

Next, an example of usage of the imaging device 100 will be described.

An object 150 subjected to spectral imaging is made up of three substances A, B, and C. The imaging device 100 performs spectral imaging of this object 150. In this example, the terahertz wave detecting device 1 detects terahertz waves reflecting off of the object 150.

Figure 11:
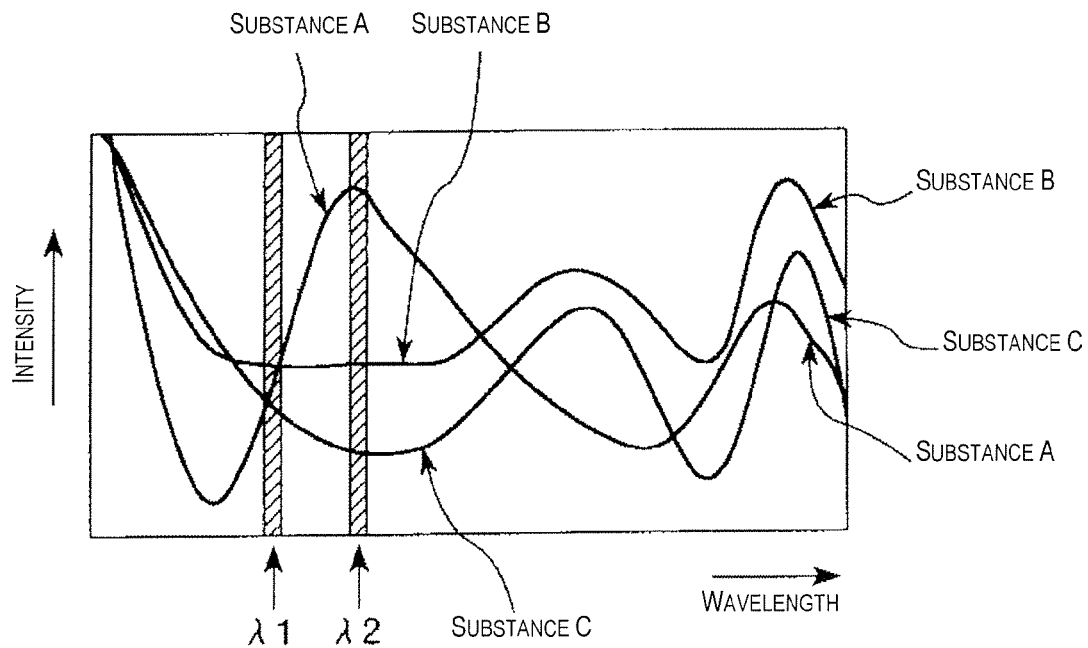
FIG. 11 is a graph illustrating the spectrum of an object in the terahertz band.

FIG. 11 is a graph illustrating the spectrum of an object 150 in the terahertz band.

Each pixel 16 of the filter 15 of the terahertz wave detecting device 11 uses a first field 161 and a second field 162.

Given an admitted wavelength $\lambda 1$ for the first field 161 and an admitted wavelength $\lambda 2$ for the second field 162, and a component intensity $\alpha 1$ for the terahertz waves reflected off of the object 150 and a component intensity $\alpha 2$ for the wavelength $\lambda 2$, the admitted wavelength $\lambda 1$ of the first field 161 and the admitted wavelength $\lambda 2$ of the second field 162 are set so that there is a noticeable difference between intensity $\alpha 2$ and intensity $\alpha 1$ ($\alpha 2 - \alpha 1$) for each of substance A, substance B, and substance C.

As shown in FIG. 11, the difference ($\alpha 2 - \alpha 1$) between the component intensity $\alpha 2$ of the terahertz wave wavelength $\lambda 2$ and the component intensity $\alpha 1$ of the wavelength $\lambda 1$ being reflected off of the object 150 is a positive value in substance A.

In substance B, the difference ($\alpha 2 - \alpha 1$) between intensity $\alpha 2$ and intensity $\alpha 1$ is zero.

In substance C, the difference ($\alpha 2 - \alpha 1$) between intensity $\alpha 2$ and intensity $\alpha 1$ is a negative value.

When performing spectral imaging of the object 150 using the imaging device 100, terahertz waves are first generated by the terahertz wave generating device 1, and the object 150 is irradiated with the terahertz waves. Next, intensities α1 and α2 of the terahertz waves reflected off of the object 150 are detected by the terahertz wave detecting device 11. The detection results are sent to the image forming unit 12. The irradiation of the object 150 with the terahertz waves and the detection of the terahertz waves reflected off of the object 150 are performed for the entire object 150. The irradiation of the object 150 with terahertz waves is performed by irradiation with light pulses at different timings for each pair of electrodes 22 by the light source unit 10, and the direction in which the terahertz waves are emitted being varied by varying the amount by which the light pulse irradiation timing is varied.

Based on the results of the detection, the image forming unit 12 finds the difference (α2−α1) between the component intensity α2 of the terahertz wave wavelength λ2 admitted by the second field 162 of the filter 15 and the component intensity α1 of the terahertz wave wavelength λ1 admitted by the first field 161. Locations on object 150 wherein the difference is a positive value is identified as substance A, locations where the difference is zero as substance B, and locations where the difference is a negative value as substance C.

Figure 12:
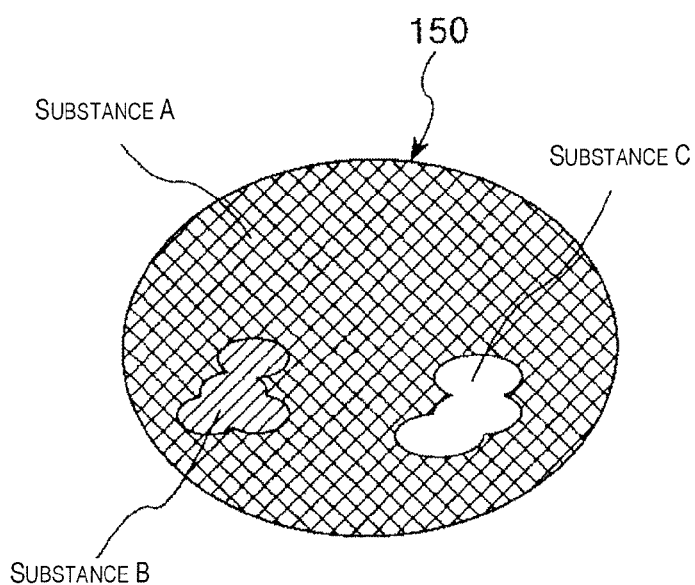
FIG. 12 is a view of an image showing the distributions of substances A, B, and C in an object.

The image forming unit 12 creates image data for an image showing the distribution of substances A, B, and C in the object 150, as shown in FIG. 12. This image data is sent from the image forming unit 12 to a monitor not shown in the drawings, and an image showing the distribution of substances A, B, and C in the object 150 is displayed on the monitor. In this image, the field of the object 150 where the substance A is distributed is, for example, black, the area where the substance B is distributed is gray, and the area where the substance C is distributed is white. As described above, it is possible to identify the various substances constituting the object 150, as well as simultaneously measure the distribution of each substance, using the imaging device 100.

The use of the imaging device 100 is not limited to that given above, and may be used, for example, to determine if a person is carrying a gun, knife, illegal substance, or the like by irradiating the person with terahertz waves, detecting the terahertz waves penetrating or reflecting off of the person, and processing using the image forming unit 12.

Embodiment of Measuring Device

Figure 13:
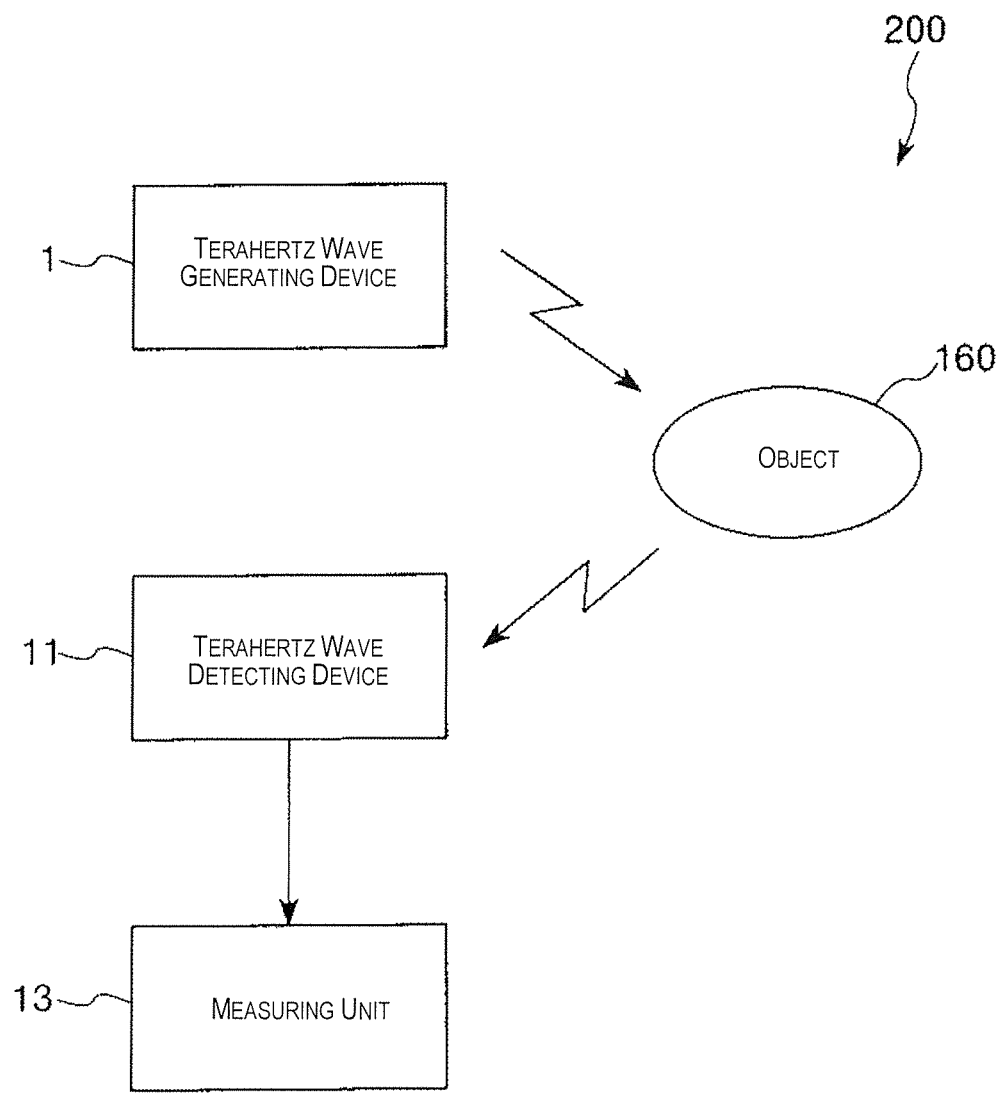
FIG. 13 is a block diagram of an embodiment of a measuring device according to the present invention.

FIG. 13 is a block diagram of an embodiment of a measuring device according to the present invention.

The following description will focus on the differences between the embodiment of a measuring device and the embodiment of an imaging device given above; similar elements will be given the same numbering as in the case of the embodiment given above, and detailed description thereof will be omitted.

As shown in FIG. 13, a measuring device 200 has a terahertz wave generating device 1 for generating terahertz waves, a terahertz wave detecting device 11 for detecting terahertz waves emitted by the terahertz wave generating device 1 and penetrating or reflected off of an object 160, and a measuring unit 13 for measuring the object 160 based on the result of a detection made by the terahertz wave detecting device 11.

Next, an example of usage of the measuring device 200 will be described.

When performing spectrometry of the object 160 using the measuring device 200, terahertz waves are first generated by the terahertz wave generating device 1, and the object 160 is irradiated with the terahertz waves. Next, the terahertz wave detecting device 11 detects the terahertz waves penetrating or reflecting off of the object 160. The detection results are sent to the measuring unit 13. The irradiation of the object 160 with the terahertz waves and the detection of the terahertz waves penetrating or reflected off of the object 160 are performed for the entire object 160. The irradiation of the object 160 with terahertz waves is performed by irradiation with light pulses at different timings for each pair of electrodes 22 by the light source unit 10, and the direction in which the terahertz waves are emitted being varied by varying the amount by which the light pulse irradiation timing is varied.

Based on the results detected, the measuring unit 13 determines the respective intensities of the terahertz waves passing through the first field 161, second field 162, third field 163, and fourth field 164 of the filter 15, and analyses the components of the object 160 and the distribution thereof.

Embodiment of Camera

Figure 14:
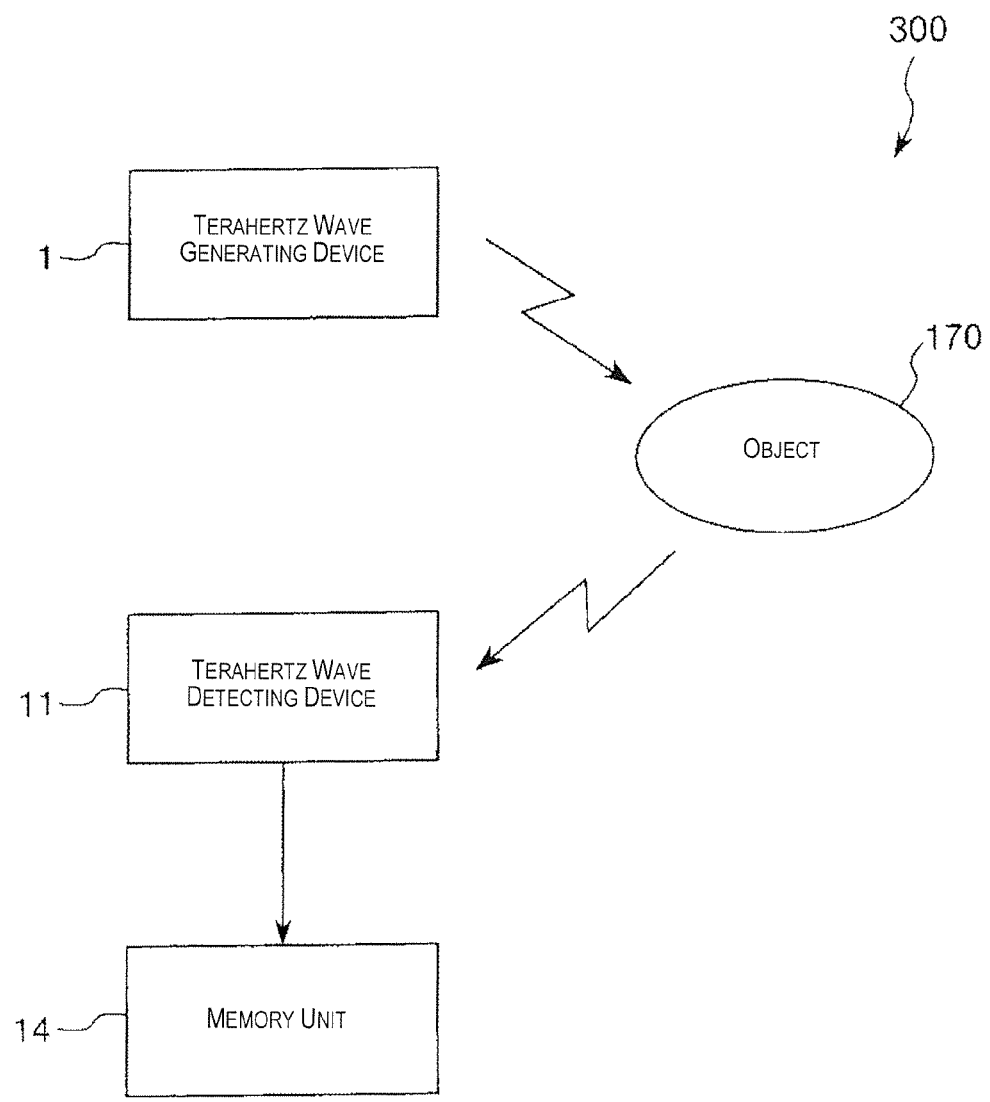
FIG. 14 is a block diagram of an embodiment of a camera according to the present invention.

FIG. 14 is a block diagram of an embodiment of a camera according to the present invention.

The following description will focus on the differences between the embodiment of a camera and the embodiment of an imaging device given above; similar elements will be given the same numbering as in the case of the embodiment given above, and detailed description thereof will be omitted.

As shown in FIG. 14, a camera 300 has a terahertz wave generating device 1 for generating terahertz waves, and a terahertz wave detecting device 11 for detecting terahertz waves emitted by the terahertz wave generating device 1 and penetrating or reflected off of an object 170.

Next, an example of usage of the camera 300 will be described.

When photographing the object 170 using the camera 300, terahertz waves are first generated by the terahertz wave generating device 1, and the object 170 is irradiated with the terahertz waves. Next, the terahertz wave detecting device 11 detects the terahertz waves penetrating or reflecting off of the object 170. The detection results are sent to a memory unit 14, where they are stored. The irradiation of the object 170 with the terahertz waves and the detection of the terahertz waves penetrating or reflected off of the object 170 are performed for the entire object 170. The irradiation of the object 170 with terahertz waves is performed by irradiation with light pulses at different timings for each pair of electrodes 22 by the light source unit 10, and the direction in which the terahertz waves are emitted being varied by varying the amount by which the light pulse irradiation timing is varied. The detection results may also be sent to an external device such as, for example, a PC. Various types of processing may be performed on the detected results by the personal computer.

The foregoing was a description of embodiments of a terahertz wave generating device, camera, imaging device, and measuring device according to the present invention with reference to the drawings, but the present invention is not limited to these embodiments; the various configurations may be substituted by other configurations having similar effects as desired. Other constituent parts may also be added to the present invention as desired.

The present invention may be a combination of two or more desired configurations (features) of the embodiment described above.

The light pulse generator of the light source device 3 (light source unit 10) according to the present invention may be a separate unit.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A terahertz wave generating device comprising:
    a plurality of light sources configured to generate pulsed light; and
    an antenna configured to generate terahertz waves by being irradiated with the pulsed light generated by the light sources, the antenna having a plurality of pairs of electrodes with the electrodes in each of the pairs facing each other across a gap portion with a predetermined distance,
    the light sources being configured to irradiate the gap portions between the electrodes in the pairs with the pulsed light such that the gap portions between the electrodes of at least two of the pairs are irradiated with the pulsed light at mutually different timings.

2. The terahertz wave generating device according to claim 1, wherein
    a direction in which the terahertz waves generated by the antenna are emitted is altered by irradiating the gap portions between the electrodes of the at least two of the pairs with the pulsed light at the mutually different timings.

3. The terahertz wave generating device according to claim 1, wherein
    an offset amount of an irradiation timing is less than a pulse duration of the pulsed light.

4. The terahertz wave generating device according to claim 1, wherein
    each of the light sources is a semiconductor laser.

5. The terahertz wave generating device according to claim 1, wherein
    the electrodes in the pairs disposed on one side of the gap portion are electrically connected.

6. A terahertz wave generating device comprising:
    a first light source configured to generate a first pulsed light;
    a second light source configured to generate a second pulsed light having a phase different from that of the first pulsed light; and
    an antenna configured to generate terahertz waves by being irradiated with the first pulsed light and the second pulsed light, the antenna including a first electrode, a second electrode, a third electrode, and a fourth electrode such that a voltage is applied between the first electrode and the second electrode and a voltage is applied between the third electrode and the fourth electrode,
    the first light source being configured to irradiate the area between the first electrode and the second electrode with the first light pulse, and
    the second light source being configured to irradiate the area between the third electrode and the fourth electrode with the second light pulse.

7. A camera comprising:
    a terahertz wave generating device configured to generate terahertz waves; and
    a terahertz wave detecting device configured to detect the terahertz waves emitted by the terahertz wave generating device and penetrating or reflecting off of an object,
    the terahertz wave generating device including
        a plurality of light sources configured to generate pulsed light; and
        an antenna configured to generate terahertz waves by being irradiated with the pulsed light generated by the light sources, the antenna having a plurality of pairs of electrodes with the electrodes in each of the pairs facing each other across a gap portion with a predetermined distance,
        the light sources being configured to irradiate the gap portions between the electrodes in the pairs with the pulsed light such that the gap portions between the electrodes of at least two of the pairs are irradiated with the pulsed light at mutually different timings.

8. An imaging device comprising:
    a terahertz wave generating device configured to generate terahertz waves;
    a terahertz wave detecting device configured to detect the terahertz waves emitted by the terahertz wave generating device and penetrating or reflecting off of an object; and
    an image forming unit configured to form an image of the object based on a result of a detection made by the terahertz wave detecting device,
    the terahertz wave generating device including
        a plurality of light sources configured to generate pulsed light; and
        an antenna configured to generate terahertz waves by being irradiated with the pulsed light generated by the light sources, the antenna having a plurality of pairs of electrodes with the electrodes in each of the pairs facing each other across a gap portion with a predetermined distance,
        the light sources being configured to irradiate the gap portions between the electrodes in the pairs with the pulsed light such that the gap portions between the electrodes of at least two of the pairs are irradiated with the pulsed light at mutually different timings.

9. A measuring device comprising:
    a terahertz wave generating device configured to generate terahertz waves;
    a terahertz wave detecting device configured to detect the terahertz waves emitted by the terahertz wave generating device and penetrating or reflecting off of an object; and
    a measuring unit configured to measure the object based on a result of a detection made by the terahertz wave detecting device,
    the terahertz wave generating device including a plurality of light sources configured to generate pulsed light; and an antenna configured to generate terahertz waves by being irradiated with the pulsed light generated by the light sources, the antenna having a plurality of pairs of electrodes with the electrodes in each of the pairs facing each other across a gap portion with a predetermined distance, the light sources being configured to irradiate the gap portions between the electrodes in the pairs with the pulsed light such that the gap portions between the electrodes of at least two of the pairs are irradiated with the pulsed light at mutually different timings.

* * * * *